United States Patent
Park et al.

(10) Patent No.: US 8,476,622 B2
(45) Date of Patent: Jul. 2, 2013

(54) ACTIVE MATRIX ORGANIC LIGHT EMITTING DIODE

(75) Inventors: Sang Hee Park, Daejeon (KR); Chi Sun Hwang, Daejeon (KR); Byoung Gon Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/343,384

(22) Filed: Jan. 4, 2012

(65) Prior Publication Data

US 2012/0168761 A1 Jul. 5, 2012

(30) Foreign Application Priority Data

Jan. 5, 2011 (KR) .................. 10-2011-0000991
Jul. 12, 2011 (KR) .................. 10-2011-0068813

(51) Int. Cl.
*H01L 29/08* (2006.01)
*H01L 35/24* (2006.01)
*H01L 51/00* (2006.01)
*H01L 29/20* (2006.01)
*H01L 33/00* (2010.01)
*H01L 29/201* (2006.01)

(52) U.S. Cl.
USPC .......... 257/40; 257/89; 257/90; 257/E31.121; 257/E31.122; 257/E31.123; 257/E51.022

(58) Field of Classification Search
USPC ................ 257/40, 89, 90, E31.121, E31.122, 257/E31.123, E51.022
See application file for complete search history.

(56) References Cited

U.S. PATENT DOCUMENTS

| | | | |
|---|---|---|---|
| 5,986,401 A | 11/1999 | Thompson et al. | |
| 7,202,504 B2 * | 4/2007 | Ikeda et al. | 257/79 |
| 7,656,085 B2 * | 2/2010 | Li et al. | 313/504 |
| 7,753,751 B2 * | 7/2010 | Yamazaki | 445/24 |
| 7,781,768 B2 * | 8/2010 | Sakakura et al. | 257/59 |
| 7,875,477 B2 * | 1/2011 | Chang et al. | 438/34 |
| 8,039,288 B2 * | 10/2011 | Yamazaki | 438/70 |
| 8,102,494 B2 * | 1/2012 | Nishida et al. | 349/137 |
| 8,164,726 B2 * | 4/2012 | Egi et al. | 349/137 |
| 8,168,523 B2 * | 5/2012 | Ohnuma et al. | 438/592 |
| 8,188,474 B2 * | 5/2012 | Hatano et al. | 257/59 |

(Continued)

FOREIGN PATENT DOCUMENTS

JP 2002-216960 A 8/2002

OTHER PUBLICATIONS

Z. Y. Xie et al., "High-contrast organic light-emitting diodes", Applied Physics Letters, vol. 84, No. 7, Feb. 16, 2004, pp. 1207-1209.

(Continued)

*Primary Examiner* — Ida M Soward
(74) *Attorney, Agent, or Firm* — Rabin & Berdo, P.C.

(57) ABSTRACT

Disclosed are an active matrix organic light emitting diode and a method for manufacturing the same. The active matrix organic light emitting diode includes: a substrate; a black matrix formed above a part of the substrate; at least one thin film transistor formed above the black matrix; a passivation film formed to entirely cover the at least one thin film transistor; a planarizing layer formed above the passivation film; a color filter formed above an upper part of the planarizing layer opposite to the position where the at least one thin film transistor is formed; and an organic light emitting diode formed above the color filter.

11 Claims, 2 Drawing Sheets

U.S. PATENT DOCUMENTS

| | | | |
|---|---|---|---|
| 8,216,878 B2* | 7/2012 | Sasaki et al. | 438/104 |
| 8,350,466 B2* | 1/2013 | Murakami et al. | 313/506 |
| 2003/0146696 A1* | 8/2003 | Park et al. | 313/506 |
| 2003/0230972 A1 | 12/2003 | Cok | |
| 2004/0135499 A1 | 7/2004 | Cok | |
| 2006/0060870 A1* | 3/2006 | Park et al. | 257/88 |
| 2006/0255719 A1* | 11/2006 | Oikawa et al. | 313/503 |
| 2007/0123135 A1* | 5/2007 | Yang et al. | 445/24 |
| 2007/0132713 A1* | 6/2007 | Seo et al. | 345/107 |
| 2007/0178672 A1* | 8/2007 | Tanaka et al. | 438/487 |
| 2009/0027323 A1* | 1/2009 | Choi | 345/88 |
| 2011/0062861 A1* | 3/2011 | Lee et al. | 313/504 |

OTHER PUBLICATIONS

Jiun-Haw Lee et al., "High contrast ratio organic light-emitting devices based on CuPC as electron transport material", Synthetic Metals, vol. 144, May 18, 2004, pp. 279-283.

\* cited by examiner

ACTIVE MATRIX ORGANIC LIGHT EMITTING DIODE

CROSS-REFERENCE TO RELATED APPLICATIONS

This application is based on and claims priority from Korean Patent Application Nos. 10-2011-0000991, filed on Jan. 5, 2011, and 10-2011-0068813, filed on Jul. 12, 2011, with the Korean Intellectual Property Office, the present disclosure of which is incorporated herein in its entirety by reference.

TECHNICAL FIELD

The present disclosure relates to an active matrix organic light emitting diode, and more particularly, to a bottom emission type active matrix organic light emitting diode for improving a contrast ratio and a method for manufacturing the same.

BACKGROUND

In general, in order to manufacture a full color active matrix organic light emitting diode (hereinafter, abbreviated as 'AMOLED'), it is necessary to pattern pixels emitting a red light component, a green light component, and a blue light component. For this purpose, a method that deposits R, G, and B color-emitting layers as separated from each other by metal masks has been generally used.

However, the above method has the following two serious problems.

First, small and medium size displays have lower contrast resolution than a TFT-LCD. The reason is that the patterning method that uses metal masks has color mixture problems and a difficulty in manufacturing fine resolution masks, which results in having a limitation to the reduction of the gap between R, G, and B color components.

Second, in the case of a large size TV, the weight of a metal mask is increased, which causes problems in processes. Further, a glass substrate is hung down, which causes a gap between the substrate and the mask.

In order to solve the above problems, a method that separates R, G, and B colors using a color filter after depositing a white OLED has been suggested. The AMOLED that uses the white OLED has an advantage of a simplified patterning method as compared with the patterning method that uses metal masks, but the emitting efficiency is about 30% less than the R, G, and B separation method.

There have been efforts to increase the emitting efficiency by developing new emitting materials and improving device structures. However, there is still a restriction that the emitting efficiency is considerably lower than the R, G, and B separation method.

Accordingly, it is required to seek methods that have the same effect as the increased emitting efficiency using an indirect method. One of the methods is related with the circular polarizer which is used for the increase of the contrast ratio of AMOLED. The light transmittance of the circular polarizer is generally about 45%. In some cases, the transmittance may be increased up to 70% by sacrificing the characteristic of the circular polarizer. The circular polarizer that is generally attached onto a surface of the display may be removed or the light transmittance thereof may be increased for the increase of output brightness.

However, in the case where the circular polarizer is removed or the transmittance of the circular polarizer is improved, the lowering of the contrast ratio of the AMOLED is inevitable.

SUMMARY

The present disclosure has been made in an effort to provide a bottom emission active matrix organic light emitting diode that has an improved contrast ratio, and a method for manufacturing the same.

An exemplary embodiment of the present disclosure provides an active matrix organic light emitting diode, including: a substrate; a black matrix formed above a part of the substrate; at least one thin film transistor formed above the black matrix; a passivation film formed to entirely cover the at least one thin film transistor; a planarizing layer formed above the passivation film; a color filter formed on an upper part of the planarizing layer opposite to the position where at least one thin film transistor is formed; and an organic light emitting diode formed above the color filter.

Another exemplary embodiment of the present disclosure provides a method for manufacturing an active matrix organic light emitting diode, including: forming a black matrix above a part of a substrate; forming at least one thin film transistor above the black matrix; forming a passivation film to entirely cover at least one thin film transistor; forming a planarizing layer above the passivation film; forming a color filter above an upper part of the planarizing layer opposite to the position where at least one thin film transistor is formed; and forming an organic light emitting diode above the color filter.

According to exemplary embodiments of the present disclosure, by providing an active matrix organic light emitting diode that forms a black matrix in advance on a part of a substrate before forming a thin film transistor and a method for manufacturing the same, it is possible to alleviate the problems of lowering of the contrast ratio accompanied by not using a circular polarizer or by using the one with high transmittance, and increase the output brightness and the life span of a large size active matrix organic light emitting diode.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In an active matrix organic light emitting diode (hereinafter, abbreviated as 'AMOLED'), a black matrix may be formed at the side of a color filter. However, this method is not helpful in improving the contrast ratio of a bottom emission type AMOLED because an external light component incident from the front is reflected from the metal surface of a thin film transistor before reaching the black matrix.

Therefore, according to an exemplary embodiment of the present disclosure, in the bottom emission type AMOLED, a black matrix is formed on a part of a substrate before forming a thin film transistor.

Hereinafter, the exemplary embodiment of the present disclosure will be described with reference to the accompanying drawings. In the description, if it is determined that the detailed description of a known configuration or function may cloud the gist of the present disclosure, the detailed description thereof will be omitted.

Figure 1:
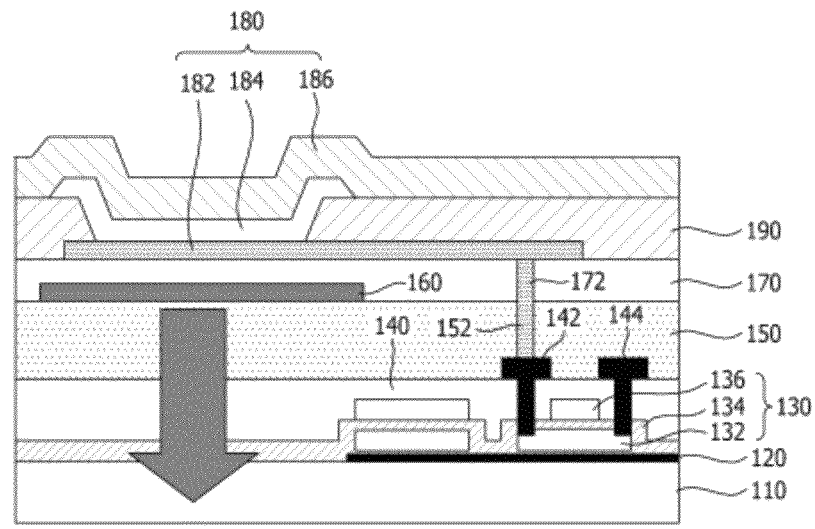
FIG. 1 is a cross-sectional view illustrating a structure of an active matrix organic light emitting diode according to an exemplary embodiment of the present disclosure.

FIG. 1 is a cross-sectional view illustrating a structure of an active matrix organic light emitting diode according to an exemplary embodiment of the present disclosure.

Referring to FIG. 1, an active matrix organic light emitting diode according to an exemplary embodiment of the present disclosure (hereinafter, abbreviated as 'AMOLED') includes a substrate 110, a black matrix 120, a plurality of thin film transistors 130, a passivation film 140, a planarizing layer 150, a color filter 160, an overcoat film 170, and an organic light emitting diode 180. Even though not shown in FIG. 1, the AMOLED may further include a planarizing film consisting of an organic material between the black matrix 120 and plurality of thin film transistors 130.

Substrate 110 may be formed of various materials including a transparent glass material which has $SiO_2$ as a main component, and a plastic material.

Black matrix 120 is formed of a single layer or multiple layers and formed on a part of substrate 110 over which plurality of thin film transistors 130 will be formed. Black matrix 120 is formed of an organic substance, an inorganic substance, or a composite material thereof, and may have a transmittance of 0 to 50%, and is formed with a thickness of 100 to 10000 Å. For example, black matrix 120 may consist of Cr having a thickness of 1500 Å and $CrO_x$ having a thickness of 1500 Å.

Plurality of thin film transistors 130 are formed above black matrix 120. At least one of plurality of thin film transistors 130 is formed for each pixel, and includes a semiconductor layer 132, a gate insulating layer 134, and a gate electrode 136.

Semiconductor layer 132 is formed above black matrix 120 and may be formed of an organic semiconductor or an inorganic semiconductor such as amorphous silicon, a poly-silicon and an oxide semiconductor. Even though not shown in the drawing, semiconductor layer 132 may include a source region, a drain region, and a channel region.

Gate insulating layer 134 is formed above semiconductor layer 132 and may be formed of $SiO_2$ and $SiN_x$.

Gate electrode 136 is formed above a portion of gate insulating layer 134 and connected with a gate line (not shown) that applies an on/off signal to the thin film transistor.

Passivation film 140 is formed on an entire surface of plurality of thin film transistors 130 to protect plurality of thin film transistors 130. For this purpose, passivation film 140 may use an inorganic insulating layer or an organic insulating layer.

The inorganic insulating layer may include $SiO_2$, $SiN_x$, SiON, $Al_2O_3$, $TiO_2$, $Ta_2O_5$, $HfO_2$, $ZrO_2$, BST, and PZT. The organic insulating layer may include a commercial polymer (PMMA and PS), a polymeric derivative having a phenolic group, an acrylic polymer, an imide polymer, an arylether polymer, an amide polymer, a fluorinated polymer, a p-xylene polymer, a vinyl alcohol polymer, and a blend thereof. Passivation film 140 may be formed of a composite laminate of an inorganic insulating layer and an organic insulating layer.

In passivation film 140, a source electrode 142 and a drain electrode 144 are formed through contact holes so as to be in contact with the source region and the drain region of thin film transistors 130, respectively. Here, source electrode 142 and drain electrode 144 are formed of a metal material having transmittance of 0 to 70% and conductivity.

Planarizing layer 150 is formed of a transparent organic material, and formed over passivation film 140 to have a first via hole 152 so that a first electrode layer 182 of organic light emitting diode 180 to be described below is electrically connected with source electrode 142 or drain electrode 144 of thin film transistor 130.

Color filter 160 is partially formed above planarizing layer 150. Specifically, color filter 160 is formed below a first electrode layer 182 of organic light emitting diode 180 that is positioned at an opposite side of plurality of thin film transistors 130. Color filter 160 may include a color filter that transmits a wavelength of a red color range, a color filter that transmits a wavelength of a green color range, and a color filter that transmits a wavelength of a blue color range.

Overcoat film 170 may be formed of a photo sensitive organic material such as an acrylic compound, and formed above planarizing layer 150 including color filter 160 to remove the step part caused by color filter 160 and planarize the surface. Overcoat film 170 includes a second via hole 172 that extends from first via hole 152 of planarizing layer 150 so that first electrode layer 182 of organic light emitting diode 180 to be described below is electrically connected to source electrode 142 or drain electrode 144 of thin film transistors 130.

Organic light emitting diode 180 is formed above overcoat film 170 where color filter 160 is disposed and includes the first electrode layer 182 and the second electrode layer 186 which face each other, and an organic light emitting layer 184 interposed therebetween.

First electrode layer 182 is a transparent film formed of ITO, IZO, ZnO, or $In_2O_3$ whose a work function is high. Further, first electrode layer 182 is connected to an external terminal to operate as an anode electrode.

A pixel defining film 190 that is an insulating material is formed above first electrode layer 182 to cover first electrode 182. An opening is formed in pixel defining film 190, so that organic light emitting layer 184 is formed in the area defined by the opening. However, in the case of the organic light emitting diode that emits a white light component likes the present disclosure, organic light emitting layer 184 is not necessary to be formed only in the area defined by the opening. Organic light emitting layer 184 may be formed over the opening of first electrode layer 182 and the upper part of pixel defining film 190.

Second electrode layer 186 includes a metal film having a low work function such as Li, Ca, LiF/Ca, LiF/Al, Al, Mg, and Ag and a reflective film formed of Ag, Mg, Al, Pt, Pd, Au, Ni, Nd, Ir, Cr, and a compound thereof. Second electrode layer 186 is connected to an external terminal to operate as a cathode electrode.

The above-mentioned first electrode layer 182 and second electrode layer 186 may have opposite polarities.

In the meantime, organic light emitting layer 184 interposed between first electrode layer 182 and second electrode layer 186 emits the white light components by electrical driving of first electrode layer 182 and second electrode layer

186. In this case, the white light component emitted from organic light emitting layer 184 preferably has a good color rendering index (CRI) (>75), and is preferably close to the coordinate (0.33, 0.33) in the CIE diagram, but is not limited thereto.

Organic light emitting layer 184 may use a small molecular organic material or a polymer organic material. If organic light emitting layer 184 is a small molecular weight organic layer formed of the small molecular weight organic material, a hole transport layer (HTL) and a hole injection layer (HIL) are laminated towards first electrode layer 182. An electron transport layer (HTL) and an electron injection layer (EIL) are laminated towards second electrode layer 186. In addition to the hole injection layer, the hole transport layer, the electron transport layer, and the electron injection layer, various layers may be laminated as needed.

In the meantime, in case of the polymer organic layer formed of the polymer organic material, only the hole transport layer is formed towards first electrode layer 182. The polymer hole transport layer is formed of poly-(2,4)-ethylene-dihydroxy thiophene (PEDOT) or polyaniline (PANI), and formed above first electrode layer 182 using an inkjet printing method or a spin coating method.

As a method for implementing the white light emitting in organic light emitting layer 184, the following two methods may be used. The first method is a down conversion type wave conversion method in which a fluorescent substance is excited by a blue or violet light component, and then various colors emitted from the fluorescent substance are mixed to form a broad and various wavelength spectra. The second method is a color mixing method in which two primary colors (blue and orange colors) or three primary colors (red, green, and blue colors) are mixed to form a white light component. However, this disclosure is not limited thereto, but various materials and various methods may be applied to implement the white light component.

FIGS. 2A to 2E are a flow chart of processes of manufacturing method of an active matrix organic light emitting diode according to an exemplary embodiment of the present disclosure.

Figure 2A:
FIGS. 2A to 2E are a flow chart of processes of a manufacturing method of an active matrix organic light emitting diode according to an exemplary embodiment of the present disclosure.

As shown in FIG. 2A, a black matrix 120 that is formed of a single layer or multiple layers is formed on a part of the substrate 110 that is formed of any one of glass and plastic to have a thickness of 100 to 10000 Å. Here, the black matrix 120 is formed of an organic substance, an inorganic substance, or a composite material thereof, and has transmittance of 0 to 50%. For example, black matrix 120 may consist of Cr having a thickness of 1500 Å and $CrO_x$ having a thickness of 1500 Å.

Figure 2B:
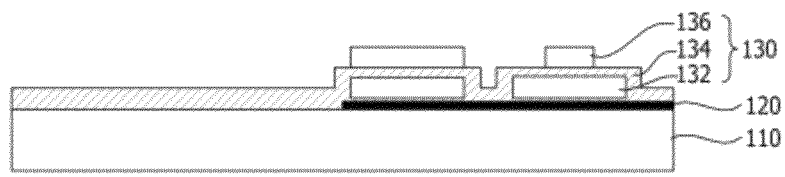

As shown in FIG. 2B, a plurality of thin film transistors 130 are formed above black matrix 120. Specifically, a semiconductor layer 132 which is formed of an organic semiconductor or an inorganic semiconductor such as amorphous silicon, a polysilicon, or an oxide semiconductor is formed above black matrix 120, a gate insulating layer 134 which is formed of $SiO_2$ and $SiN_x$ is formed above semiconductor layer 132, and a gate electrode 136 is partially formed above gate insulating layer 134 to form plurality of thin film transistors 130.

Even though not shown in the drawing, a planarizing film that is formed of an organic material may be formed above black matrix 120 before forming plurality of thin film transistors 130.

Figure 2C:
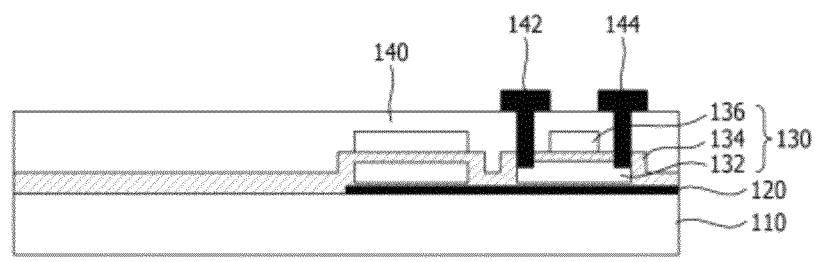

As shown in FIG. 2C, a passivation film 140 is formed on an entire surface of plurality of thin film transistors 130 to protect plurality of thin film transistors 130. Passivation film 140 may use an inorganic insulating layer or an organic insulating layer. Passivation film 140 may also be formed of a composite lamination of an organic insulating film and an inorganic insulating film.

Then, a contact hole is formed in passivation film 140 and a metal material having transmittance of 0 to 70% and conductivity is filled in the contact hole to form a source electrode 142 and a drain electrode 144 so as to be in contact with the source region and the drain region of thin film transistors 130, respectively.

Figure 2D:
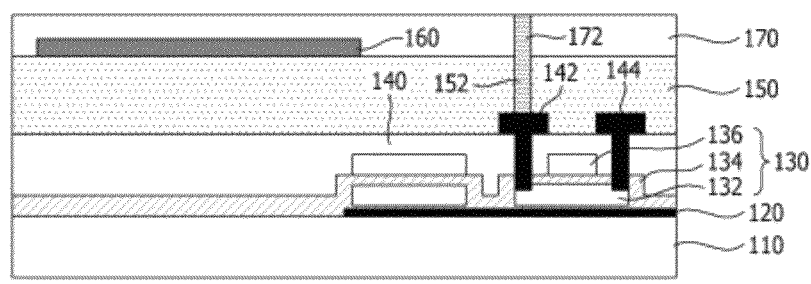

As shown in FIG. 2D, a planarizing layer 150 that is formed of a transparent organic material is formed over passivation film 140. In this case, a first via hole 152 is formed in planarizing layer 150 so that a first electrode layer 182 of organic light emitting diode 180 to be described below is electrically connected with source electrode 142 or drain electrode 144 of thin film transistor 130.

A color filter 160 is partially formed above planarizing layer 150. Specifically, color filter 160 is formed below first electrode layer 182 of organic light emitting diode 180 that is positioned at an opposite side of plurality of thin film transistors 130.

Thereafter, an overcoat film 170 that is formed of a photo sensitive organic material such as an acrylic compound is formed above planarizing layer 150 including color filter 160 so as to remove the step part caused by color filter 160 and planarize the surface. In this case, overcoat film 170 includes a second via hole 172 that extends from first via hole 152 of planarizing layer 150 so that first electrode layer 182 of organic light emitting diode 180 is electrically connected to source electrode 142 or drain electrode 144 of thin film transistors 130.

Figure 2E:
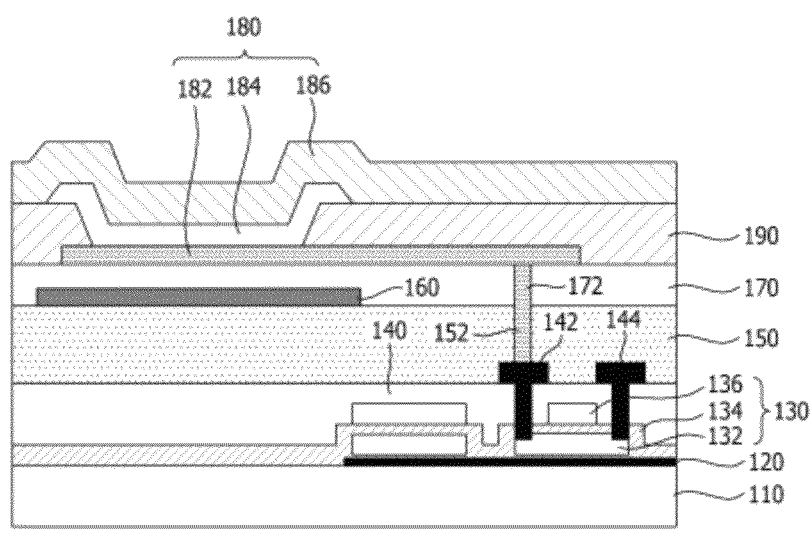

As shown in FIG. 2E, an organic light emitting diode 180 is formed on a upper part of overcoat film 170 where color filter 160 is disposed. Specifically, a first electrode layer 182 that includes a transparent film formed of ITO, IZO, ZnO, or $In_2O_3$ whose a work function is high is formed above overcoat film 170.

A pixel defining film 190 that is an insulating material is formed above first electrode layer 182 to cover first electrode 182. An opening is formed in pixel defining film 190 so that organic light emitting layer 184 is formed in the area defined by the opening or throughout the whole area.

A second electrode layer 186 is formed above organic light emitting layer 184. Second electrode layer 186 includes a metal film having a low work function such as Li, Ca, LiF/Ca, LiF/Al, Al, Mg, and Ag and a reflective film formed of Ag, Mg, Al, Pt, Pd, Au, Ni, Nd, Ir, Cr, and a compound thereof.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An active matrix organic light emitting diode, comprising:
    a substrate;
    a black matrix formed above a part of the substrate;
    at least one thin film transistor formed above the black matrix;
    a passivation film formed above and entirely covering the at least one thin film transistor;
    a planarizing layer formed above the passivation film;

a color filter formed on an upper part of the planarizing layer opposite to the position where the at least one thin film transistor is formed; and an organic light emitting diode formed above the color filter.

2. The active matrix organic light emitting diode of claim 1, wherein the substrate is formed of any one of glass and plastic.

3. The active matrix organic light emitting diode of claim 1, wherein the transmittance of the black matrix is 0 to 50%.

4. The active matrix organic light emitting diode of claim 1, further comprising:

a planarizing film disposed between the black matrix and the at least one thin film transistor.

5. The active matrix organic light emitting diode of claim 1, wherein each of the thin film transistors includes:

a semiconductor layer including a source region, a drain region, and a channel region;

a gate insulating film formed above the semiconductor layer; and a gate electrode formed above the gate insulating layer.

6. The active matrix organic light emitting diode of claim 5, wherein the passivation film includes:

a source electrode formed to be in contact with the source region; and a drain electrode formed to be in contact with the drain region.

7. The active matrix organic light emitting diode of claim 6, wherein the source electrode and the drain electrode are formed of a metal material having transmittance of 0 to 70% and conductivity.

8. The active matrix organic light emitting diode of claim 1, wherein the black matrix includes an organic substance or an inorganic substance.

9. The active matrix organic light emitting diode of claim 1, wherein a thickness of the black matrix is 100 to 10000 Å.

10. The active matrix organic light emitting diode of claim 1, wherein the black matrix is formed of a single layer or multiple layers.

11. The active matrix organic light emitting diode of claim 1, wherein the organic light emitting diode is a white organic light emitting diode.

* * * * *